United States Patent
Gugwad et al.

(10) Patent No.: US 12,183,427 B1
(45) Date of Patent: Dec. 31, 2024

(54) SYSTEM AND METHOD FOR WRITE CLOCK DOUBLE DATA RATE DUTY CYCLE CORRECTION

(71) Applicant: Cadence Design Systems, Inc., San Jose, CA (US)

(72) Inventors: Sachin Ramesh Gugwad, Bangalore (IN); Hari Anand Ravi, Karnataka (IN)

(73) Assignee: Cadence Design Systems, Inc., San Jose, CA (US)

( * ) Notice: Subject to any disclaimer, the term of this patent is extended or adjusted under 35 U.S.C. 154(b) by 221 days.

(21) Appl. No.: 17/967,040

(22) Filed: Oct. 17, 2022

(51) Int. Cl.
  *G11C 7/00* (2006.01)
  *G11C 7/10* (2006.01)
  *G11C 7/14* (2006.01)
  *G11C 7/22* (2006.01)

(52) U.S. Cl.
  CPC ............ *G11C 7/222* (2013.01); *G11C 7/1066* (2013.01); *G11C 7/1096* (2013.01); *G11C 7/14* (2013.01)

(58) Field of Classification Search
  CPC ............ G11C 2207/2254; G11C 7/222; G11C 29/023; G11C 29/028; G11C 29/12015; G11C 29/46; G11C 29/50012; G11C 7/1069; G11C 7/1096; G11C 7/1066; G11C 7/1093; G11C 11/4076; G11C 11/409; G11C 7/1045; G11C 7/1072; G11C 7/22; G11C 29/52; G11C 11/4093; H03K 5/1565; H03K 3/017; H03K 3/012; H03K 2005/00019; H03K 5/05; H03K 5/13; H03K 5/133; H03K 5/135; H03K 7/08
  See application file for complete search history.

(56) References Cited

U.S. PATENT DOCUMENTS 9,154,148 B2 * 10/2015 Schafferer ............... H03M 1/06

* cited by examiner

*Primary Examiner* — Thong Q Le
(74) *Attorney, Agent, or Firm* — Mark H. Whittenberger; Holland & Knight LLP

(57) ABSTRACT

The present disclosure relates to a system and method for duty cycle correction is provided. The method may include receiving a signal at a duty cycle adjuster and performing serializer clock duty cycle correction at the duty cycle adjuster. The method may further include performing true clock duty cycle correction at a transmitter duty cycle adjuster and performing complementary duty cycle distortion correction at the transmitter duty cycle adjuster.

18 Claims, 12 Drawing Sheets

| # | WCK_dcc_dm_EN | WCK_dcc_dm_mode<1:0> | Modes | Description |
|---|---|---|---|---|
| 1 | 0 | xx | DCC Disable Mode | DCC is disabled for WCK |
| 2 | 1 | 00 | Source clock (Serializer) duty cycle correction | Duty cycle adjuster block is adjusted to correct duty cycle. Output is observed through WCK_dcc_dm_Z (Conventional Step) |
| 3 | 1 | 01 | WCK IO PAD_t duty cycle correction | Transmitter TX_DCDP<3:0> is adjusted to correct duty cycle. Output is observed through WCK_dcc_dm_Z (Additional Proposed Step) |
| 4 | 1 | 10 | WCK IO PAD_c duty cycle correction | Transmitter TX_DCDN<3:0> is adjusted to correct duty cycle. Output is observed through WCK_dcc_dm_Z (Additional Proposed Step) |

FIG. 6

SYSTEM AND METHOD FOR WRITE CLOCK DOUBLE DATA RATE DUTY CYCLE CORRECTION

DISCUSSION OF THE RELATED ART

A typical computing device is implemented with a microprocessor, memory, and a number of other modules depending on the function to be performed by the computing device. Double data rate (DDR) random access memory (RAM) is a particular type of RAM commonly used in current technology that performs two read accesses or two write accesses per clock cycle. Microprocessors and DDR RAM both operate on various different power supply voltages. Interface circuits that can convert between different signal levels and different drive levels are used to allow for compatible communications between microprocessors and memory devices.

A low power double data rate (LPDDR) or LPDDR5x/5 memory interface is a high speed parallel data transmission protocol primarily used for mobile applications. The write clock (WCK) is a high speed clock used for all DRAM write and read transactions. It has a tight duty cycle specification set by the Joint Electron Device Engineering Council (JEDEC) standard for LPDDR5x DRAMs. Due to process, voltage and temperature variation it is difficult to meet this specification without having a correction method. Moreover, the source clock duty cycle correction methods used in conventional approaches are not sufficient to meet this specification.

SUMMARY

In one or more embodiments of the present disclosure, a method for duty cycle correction is provided. The method may include receiving a signal at a duty cycle adjuster and performing serializer clock duty cycle correction at the duty cycle adjuster. The method may further include performing true clock duty cycle correction at a transmitter duty cycle adjuster and performing complementary duty cycle distortion correction at the transmitter duty cycle adjuster.

One or more of the following features may be included. The transmitter duty cycle adjuster may be included within a write clock (WCK) transmit path. The method may include receiving an output of the transmitter duty cycle adjuster at a duty cycle monitor. The method may further include providing a true clock duty cycle correction output to a dynamic random access memory. The method may also include providing a complementary clock duty cycle correction output to a dynamic random access memory. The method may further include training an optimal reference voltage prior to performing WCK transmit clock duty cycle correction. The method may also include determining one or more final duty cycle correction bits of the true clock duty cycle correction of the transmitter based upon, at least in part, an output from the duty cycle monitor. The method may further include determining one or more final duty cycle correction bits of the complementary clock duty cycle correction of the transmitter based upon, at least in part, an output from the duty cycle monitor. The method may also include receiving an output from the write clock (WCK) transmit path at a receiver. The method may further include receiving an output from the receiver at a duty cycle monitor.

In one or more embodiments of the present disclosure, a duty cycle correction system is provided. The system may include a duty cycle adjuster configured to receive a signal and to perform serializer clock duty cycle correction. The system may also include a transmitter duty cycle adjuster configured to perform true clock duty cycle correction, wherein the transmitter duty cycle adjuster is further configured to perform complementary duty cycle distortion correction.

One or more of the following features may be included. The transmitter duty cycle adjuster may be included within a write clock (WCK) transmit path. The system may include a duty cycle monitor configured to receive an output of the transmitter duty cycle adjuster. The system may further include a dynamic random access memory configured to receive a true clock duty cycle correction output. The dynamic random access memory may be configured to receive a complementary clock duty cycle correction output. An optimal reference voltage may be trained prior to performing transmit clock duty cycle correction. The system may be configured to determine one or more final duty cycle correction bits of the true clock duty cycle correction of the transmitter based upon, at least in part, an output from the duty cycle monitor. The system may be configured to determine one or more final duty cycle correction bits of the complementary clock duty cycle correction of the transmitter based upon, at least in part, an output from the duty cycle monitor. The system may include a receiver configured to receive an output from the write clock (WCK) transmit path. The system may include a duty cycle monitor configured to receive an output from the receiver.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

FIG. 6 shows a write clock cycle correction control table consistent with an embodiment of the present disclosure;

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Figure 1:
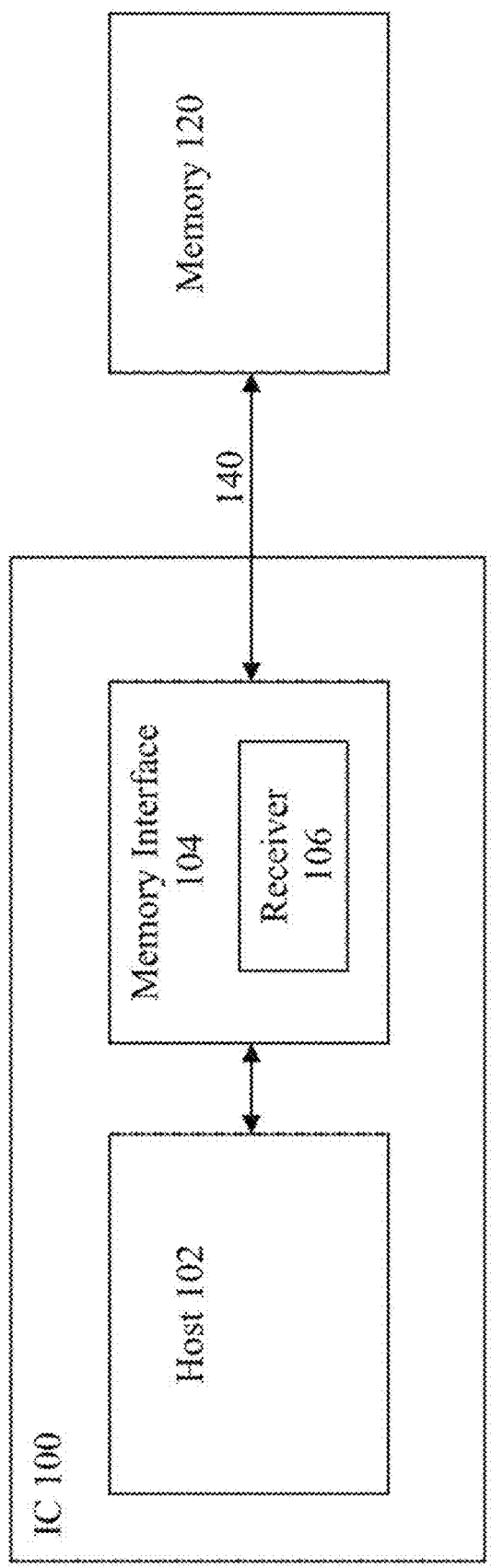
FIG. 1 is a block diagram of an example system in which the present embodiments may find useful application.

FIG. 1 illustrates an example interface between an integrated circuit (IC) 100 and a memory module 120, in accordance with some embodiments described herein. The memory module 120 may be a dynamic random access memory (DRAM) that may be connected to the integrated circuit by a bus 140, which may include an address bus, a data bus, read-write (R/W) signals, and a chip-enable (CE) signal. IC 100 may be an application specific integrated circuit (ASIC) or a system on a chip (SoC). Host 102 may be a microprocessor such as a CPU, DSP or processor core. Memory module 120 may be controlled on a system clock and can therefore be referred to as SDRAM. Embodiments of IC 100 may include additional components than shown in FIG. 1, however illustration thereof is omitted herein for sake of clarity.

Single data rate (SDR) SDRAM was originally built to execute one memory read access or one write access per clock cycle. On each clock cycle, an n-bit word may be transferred to or from the memory. The word length is, in some embodiments, configured in multiples of eight, and in more recent computer machines, it is common to transfer 64-bit words per clock cycle. DDR SDRAM was implemented as an improvement over SDR SDRAM and is capable of performing two read accesses or two write accesses per clock cycle. This was accomplished by performing one access on the rising edge of the clock and one access on the falling edge of the clock. In this manner, the data transfer rate may be doubled by transferring two 64-bit words per clock cycle. The standard protocols for operating DDR SDRAM are defined by JEDEC, with the most recent standards including DDR4, DDR5, GDDR6, etc.

In some embodiments, the operation of host 102 may involve the execution of programs that are loaded into the memory module 120 so as to create, edit, and delete data that may also be stored in the memory module 120 or other devices. Specifically, each microprocessor operation involves a fetch and execute cycle where an instruction is read from the memory module 120, decoded by the host 102, and executed. Also, the execution of the instruction often involves a data read or a data write to the memory module 120. Each of these instruction cycles may be performed synchronously to a system clock, with the duration of the instruction cycle lasting between one and three clock cycles.

More particularly, during a read operation, the host 102 may indicate the address location from which data from the memory module 120 is to be read. Memory interface 104 may be responsible for indicating the address on the address bus, floating the data bus (e.g., high Z or high impedance state), and asserting the CE and R/W signals for a read operation. Then the memory module 120 may place the data from the memory location indicated by the address bus onto the data bus. The memory interface 104 may then read the data from the data bus. More particularly, receiver 106 may convert the data signals from the memory module 120 to the voltage levels needed by host 102, and the read operation is complete. In this regard, memory types such as DDR4 typically operate between a VDDQ=1.32 Volt supply voltage down to a VDDQ=1.08 Volt supply voltage, while current microprocessor cores operate with a power supply voltage as low as VDD-0.65 Volts. The microprocessor supply voltage, core supply voltage, or signal supply voltage will be referred to herein as VDD while the memory supply voltage or I/O supply voltage will be referred to as VDDQ.

Figure 2:
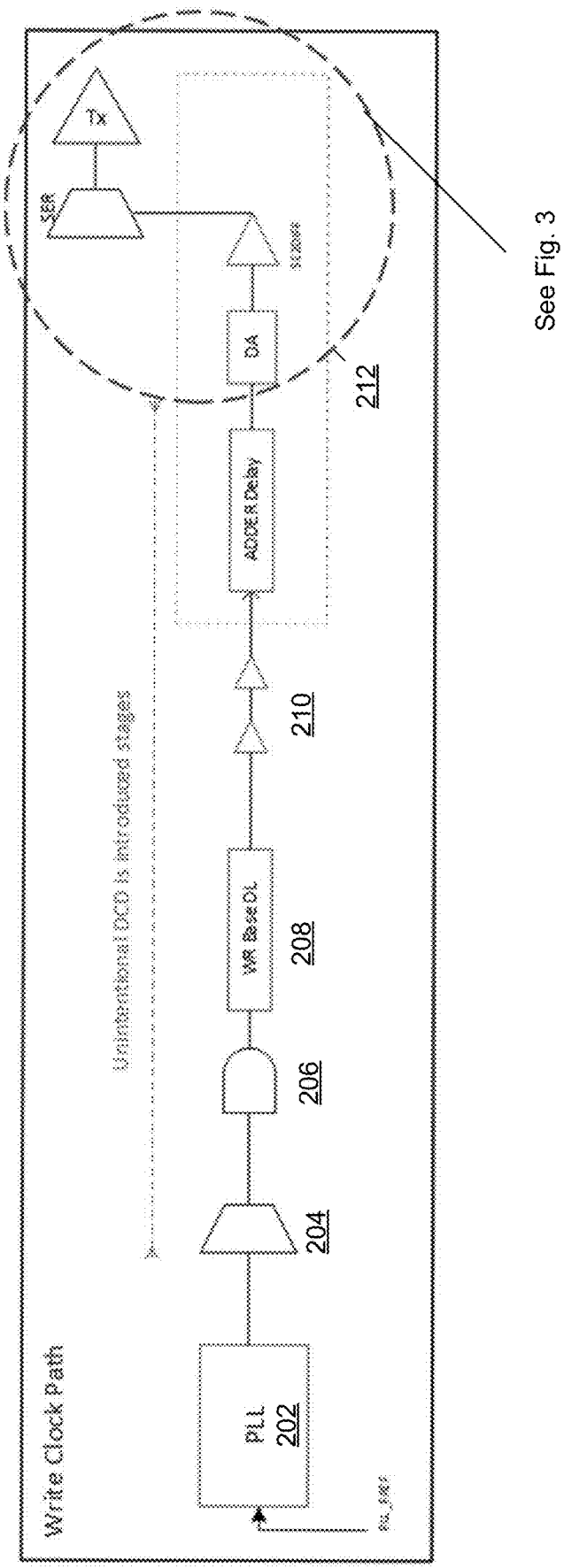
FIG. 2 shows a diagram illustrating an example write clock path consistent with an embodiment of the present disclosure.

Referring now to FIG. 2 a diagram illustrating an example write clock path consistent with an embodiment of the present disclosure is provided. As discussed above, the write clock (WCK) is a high speed clock used for all DRAM write and read transactions. In the example of FIG. 2, unintentional duty cycle distortion (DCD) may be introduced as a signal is transmitted from a phase locked loop (PLL) 202 through a clock multiplexer 204, clock gate 206, base delay 208, clock tree 210 and eventually to serializer 212. The WCK transmit path is shown in FIG. 3, which is discussed in further detail below.

Figure 3:
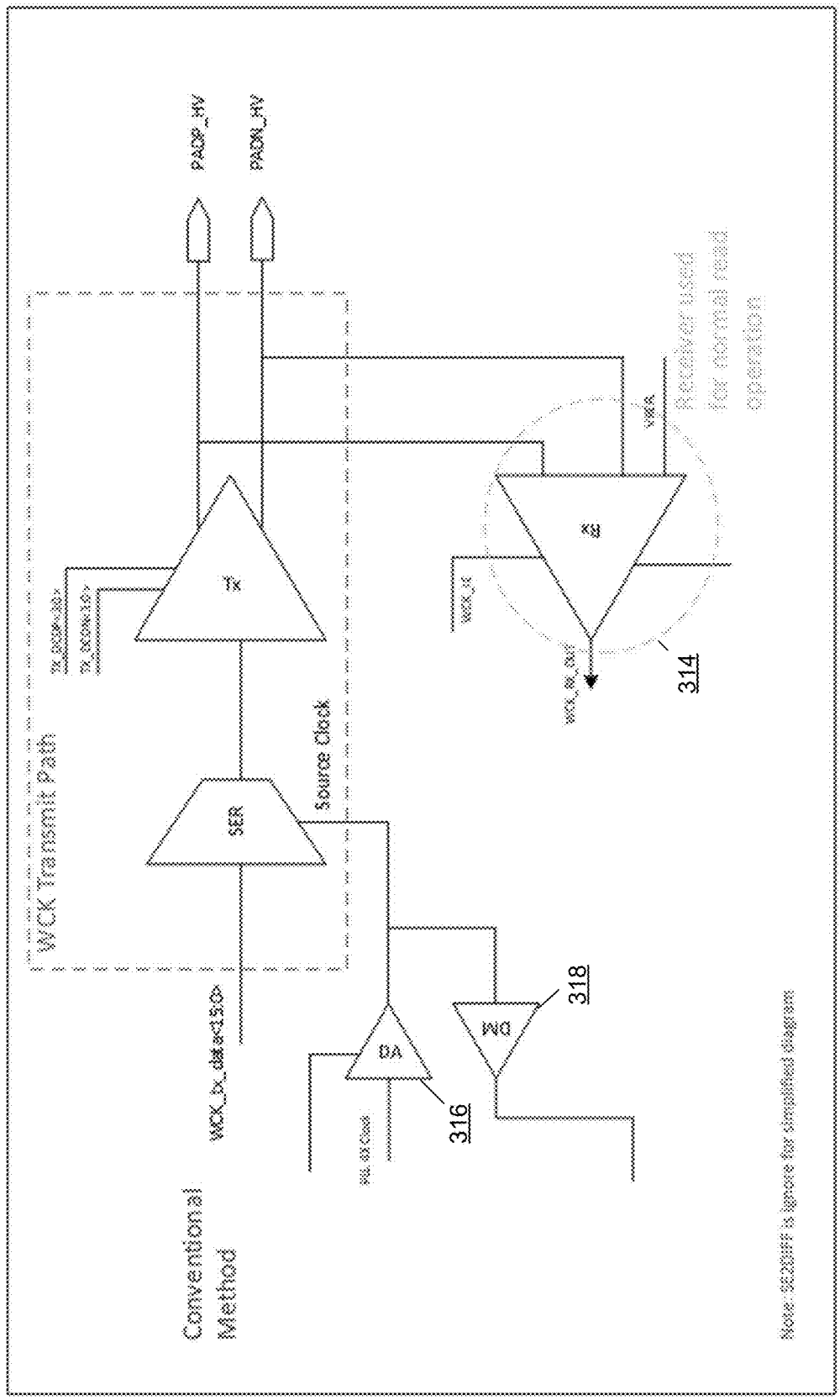
FIG. 3 shows a block diagram consistent with an embodiment of the present disclosure.

Referring now to FIG. 3 a block diagram depicting an example WCK duty cycle correction method consistent with existing approaches is provided. The output of the WCK transmit path may be provided to receiver 314, which may be used for normal read operation. The WCK transmit path may be in electrical communication with duty cycle adjuster 316 and duty cycle monitor 318. DM is a duty cycle measure block, whose output will be logic 1 if the duty cycle of the input clock given to the block is >50%. If the duty cycle is <50%, output of the DM block will be logic 0. DA (Duty cycle Adjust) block is used to adjust the duty cycle of the input clock. DA block takes in a few control bits (known as "DA code"), based on which the duty cycle of the input clock is adjusted. DCC (Duty Cycle Correction) loop is where, based on the DM output, DA codes are adjusted by a finite state machine till the duty cycle of the clock used by the serializer is 50%. In one implementation, the output of DA block may be fed to a single ended to differential (SE2DIFF) block, which generates true and complementary clocks to serializer.

Figure 4:
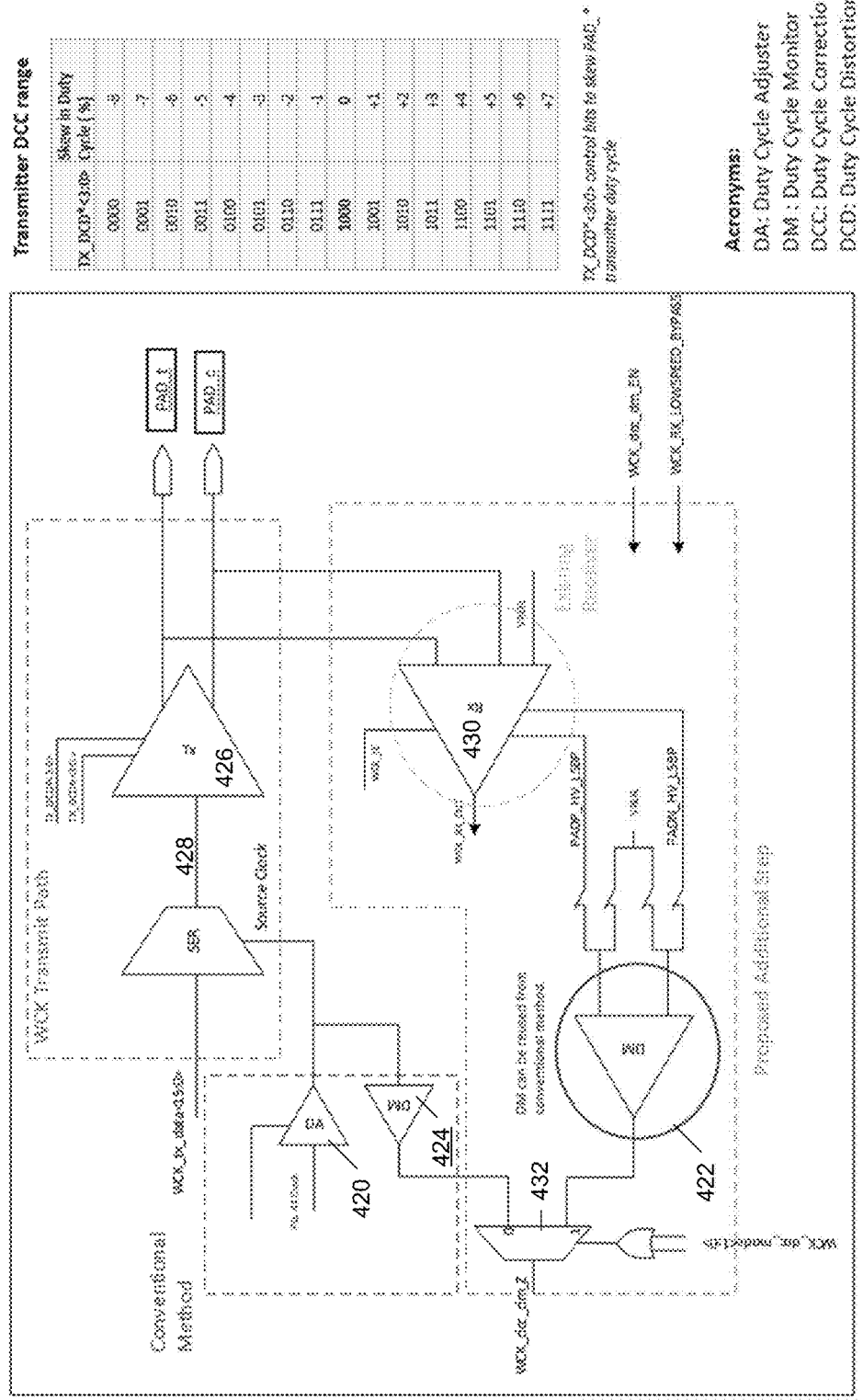
FIG. 4 shows a block diagram consistent with an embodiment of the present disclosure.

Referring now to FIG. 4 a block diagram consistent with an embodiment of the present disclosure is provided. The WCK IO duty cycle correction method proposed herein, may be configured to correct the duty cycle distortion introduced by the high speed serializer and transmitter by monitoring the PAD voltage in addition to the conventional source clock duty cycle correction method. In 400, 420 and 424 are DA and DM blocks used to adjust and measure the duty cycle of serializer clock. Serialized data 428 is connected to the differential transmitter 426, which transmits true clock PAD_t and complementary clock PAD_c, whose duty cycles are monitored using another DM block (422). Inputs to the DM 422 are tapped at the input of existing receiver through a series switch. The switch can be turned OFF during normal high speed read operation of the receiver to avoid loading of the DM block on PAD_t and PAD_c nets. Mux 432 selects output of either DM block 424 or 422 Output of the mux 432 goes to a finite state machine which then adjusts the duty cycle of either serializer clock or transmitter pad depending on the mode of operation as shown in 600. Duty cycle of serializer clock is corrected using duty cycle adjust codes of DA 420. Duty cycles of PAD_t and PAD_c are corrected using TX_DCDP<3:0> and TX_DCDN<3:0> bits respectively.

In operation, the duty cycle distortion correction process may include a first step wherein serializer clock duty cycle correction may be performed using duty cycle adjuster block 420. The process may enable WCK_dcc_dm_EN=1 and set WCK_dcc_mode<1:0>=00. Duty cycle monitor 424 may monitor the clock at the input of the serializer. The process may update the duty cycle adjuster code by monitoring the output of duty cycle monitor 424 and may lock the duty cycle adjuster code when the duty cycle distortion is at a minimum.

Write clock (WCK) may be transmitted to DRAM to capture the data transmitted by the host. WCK is also used by DRAM to send data back to the host. As the signal integrity of WCK is a critical aspect in meeting overall system timing (for both read and write operations), it is differential in nature (Voltage noise margin improves when clocks are differential). In 400, PAD_t is the true clock whose polarity is in phase with the input of the transmitter (428). PAD_c is the complementary clock, whose polarity is 180 degrees out of phase with the input of the transmitter (428).

In some embodiments, the process may then perform PAD_t (true clock) duty cycle correction using transmitter duty cycle adjuster embedded in the transmitter 426. This may be performed using transmitter duty cycle distortion bits. Accordingly, the process may enable the receiver in duty cycle correction mode by setting WCK_dcc_mode<1:0>=01. The process may send logic high data on WCK and then sweep VREFL (VREFL is a DC reference voltage provided to the receiver) from low to high value until the output of the receiver is changed from high to low. The process may store the value as logic high value, send logic low data on WCK, and then sweep VREFL from a high to low value until the output of the receiver is changed from low to high. The value may be stored as a logic low value. The process may set the optimal VREF value as an average of logic high level and logic low level. The process may enable WCK_dcc_dm_EN=1, monitor PAD_t using the duty cycle monitor, and adjust the TX_DCDP bits until the duty cycle distortion is corrected. The process may lock the TX_DCDP bits when PAD_tDCD is at a minimum.

In some embodiments, the process may then perform PAD_c (complementary clock) duty cycle distortion correction using a transmitter duty cycle adjuster. The final duty cycle correction bits for WCK PAD_t and PAD_c of the transmitter may be chosen based on duty cycle monitor block 422 output. The process may enable the receiver in duty cycle correction mode by setting WCK_dcc_mode<1:0>=10. The process may then send logic high data on WCK and sweep VREFL from high to low value till output of receiver is changed from high to low. The process may store the value as logic low value, send logic low data on WCK, and sweep VREFL from low to high value until the output of the receiver is changed from low to high. The process may store the value as logic high value, set the optimal VREF value as an average of logic high level and logic low level.

The process may then enable WCK_dcc_dm_EN=1, monitor PAD_c using duty cycle monitor, adjust TX_DCDN until duty cycle distortion is corrected. The process may lock TX_DCDN bits when PAD_c DCD is at a minimum.

Figure 5:
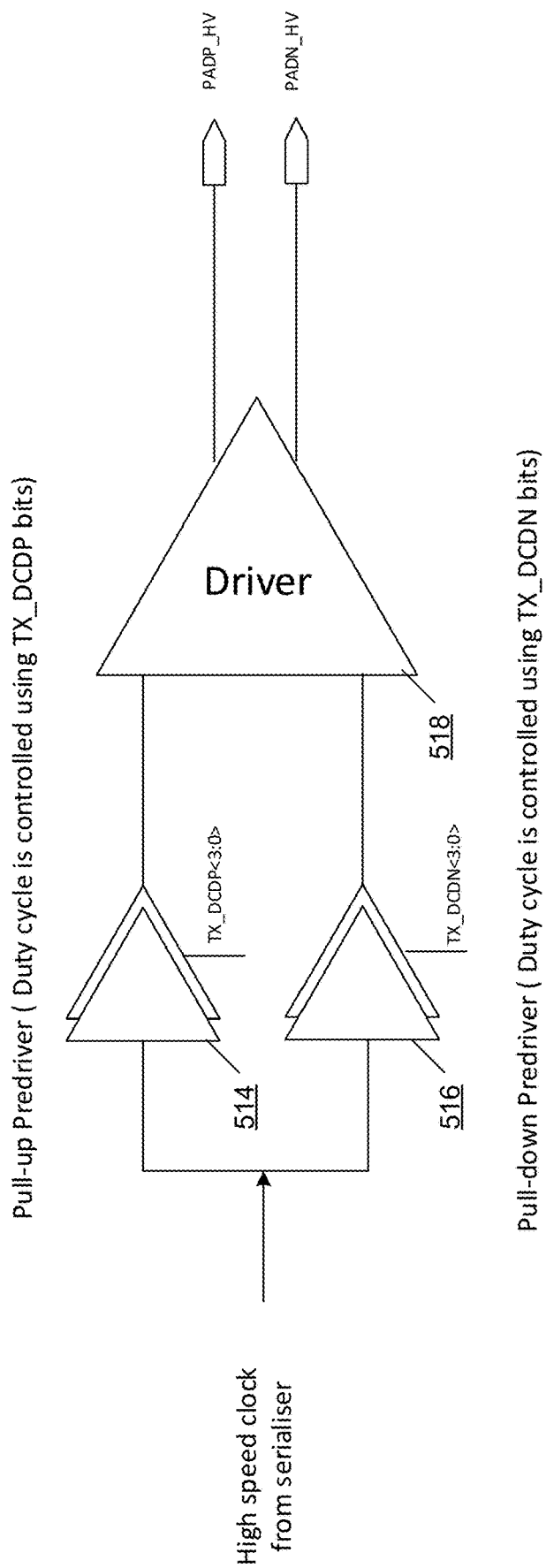
FIG. 5 shows an example write clock transmitter consistent with an embodiment of the present disclosure.

Referring now to FIG. 5 an example write clock transmitter consistent with an embodiment of the present disclosure is provided. In operation, a high speed clock signal may be received from the serializer. The transmitter may include both pull-up pre-driver 514 and pull-down pre-driver 516 which may feed primary driver 518. A write clock duty cycle correction control table is provided in FIG. 6.

Figure 7:
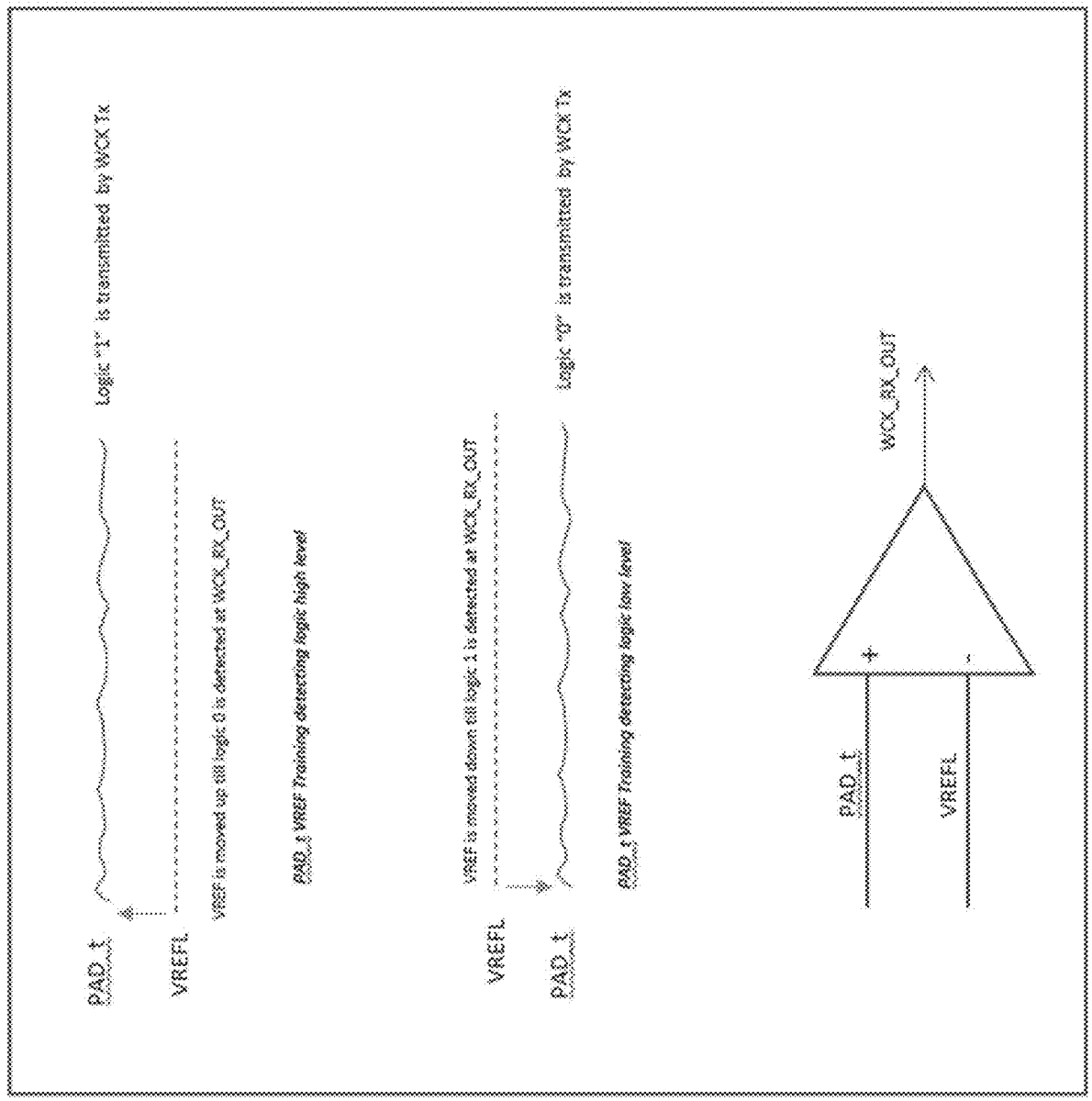
FIGS. 7-8 show voltage reference (VREF) training pictorial diagrams consistent with an embodiment of the present disclosure.
Figure 8:
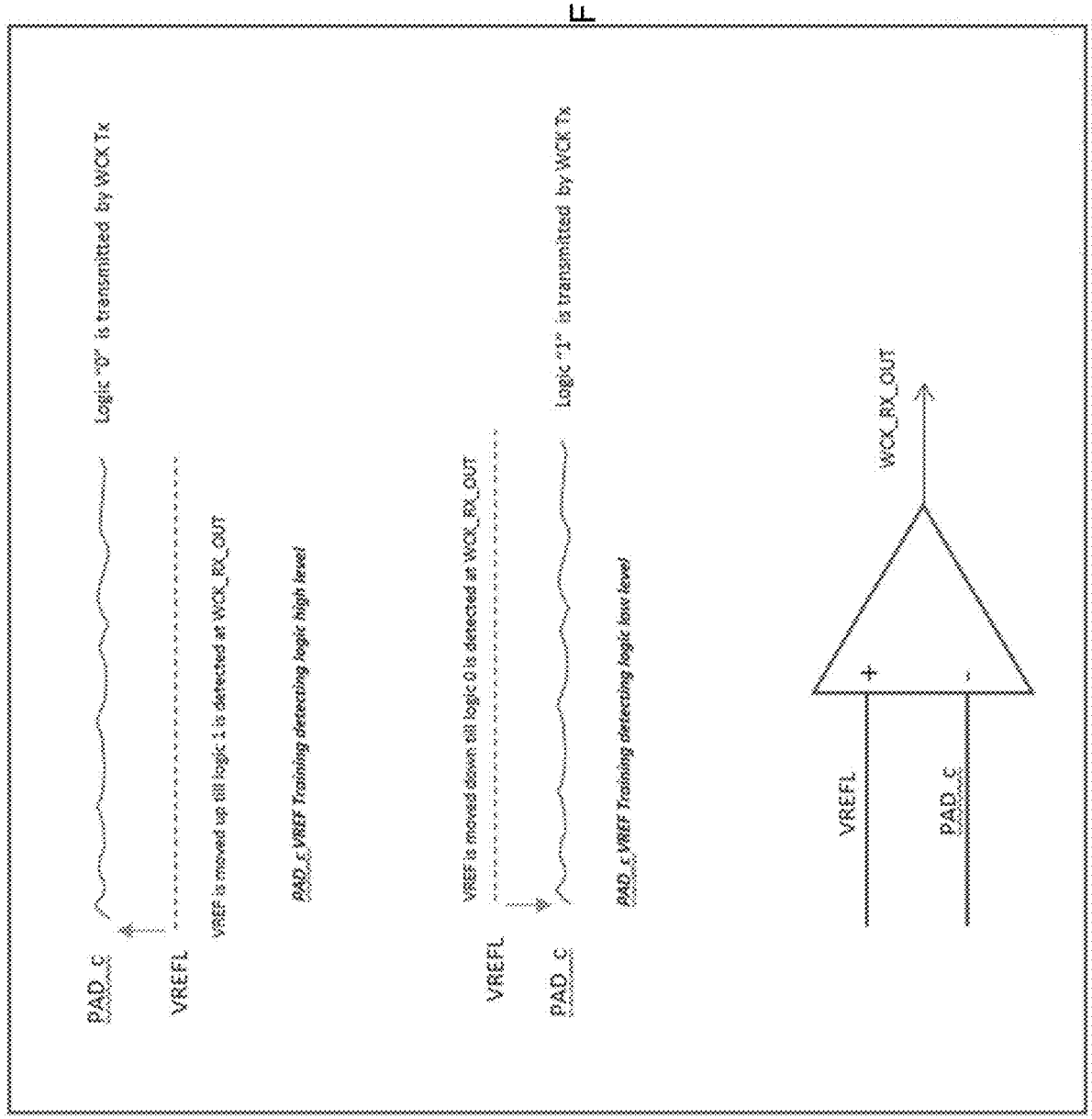

Referring now to FIGS. 7-8 voltage reference (VREFL) training pictorial diagrams consistent with embodiments of the present disclosure are provided. FIG. 7 shows PAD_t while FIG. 8 shows PAD_c examples.

Figure 9:
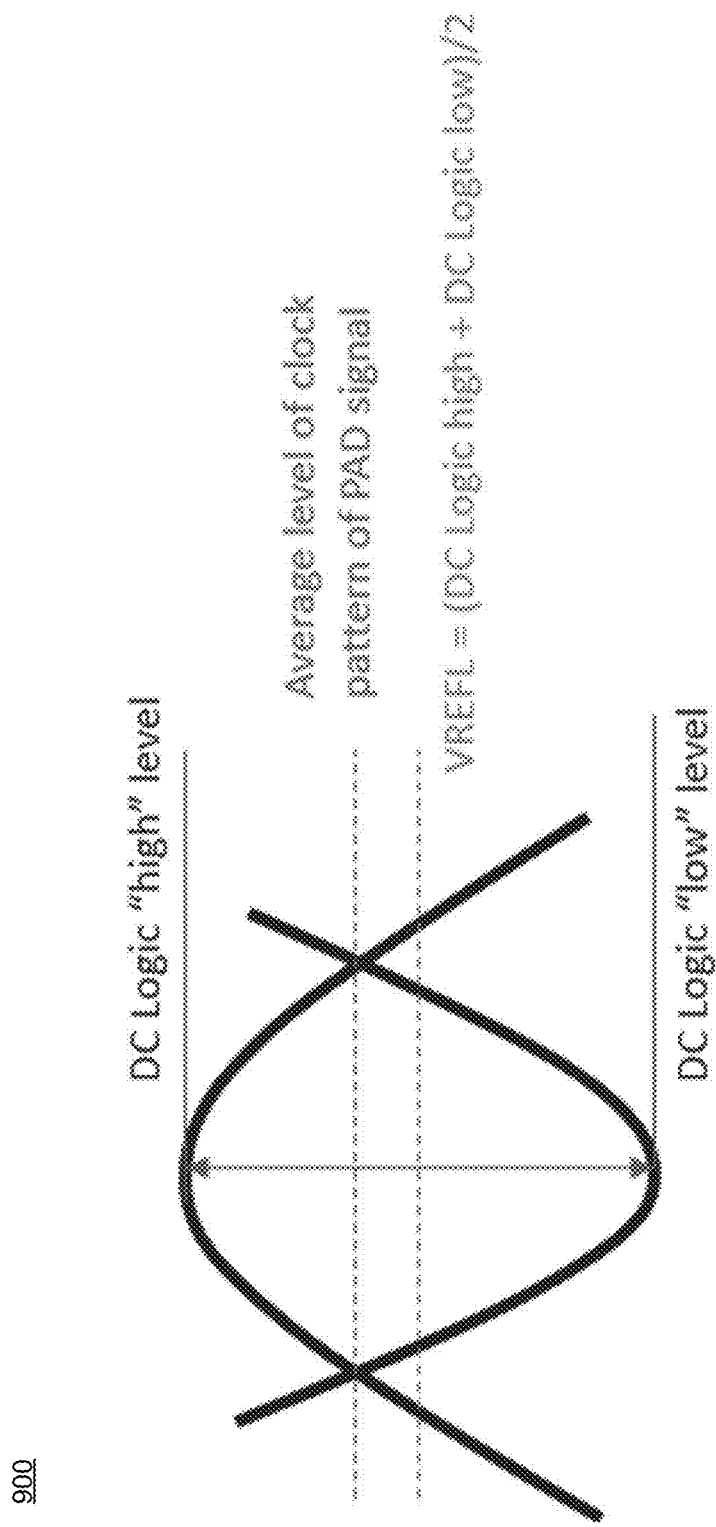
FIGS. 9-10 show eye diagrams consistent with an embodiment of the present disclosure.
Figure 10:
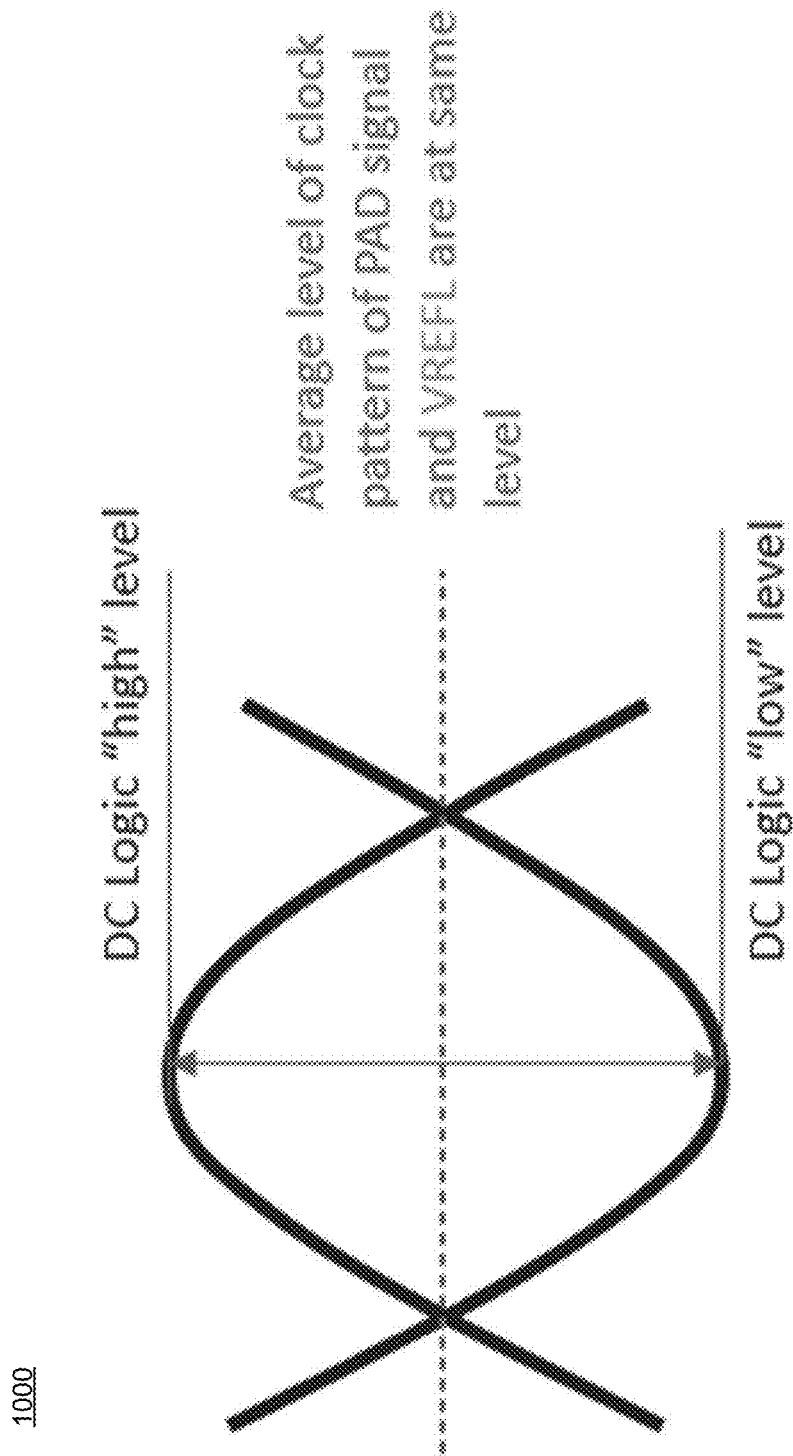

Referring now to FIGS. 9-10, eye diagrams consistent with embodiments of the present disclosure are provided. FIG. 9 shows a PAD_t/PAD_c eye diagram before correction, where the average level is shifted at the higher side due to duty cycle distortion. FIG. 10 shows a PAD_t/PAD_c eye diagram after correction, where the shift in the average level showed in FIG. 9 is corrected.

Figure 11:
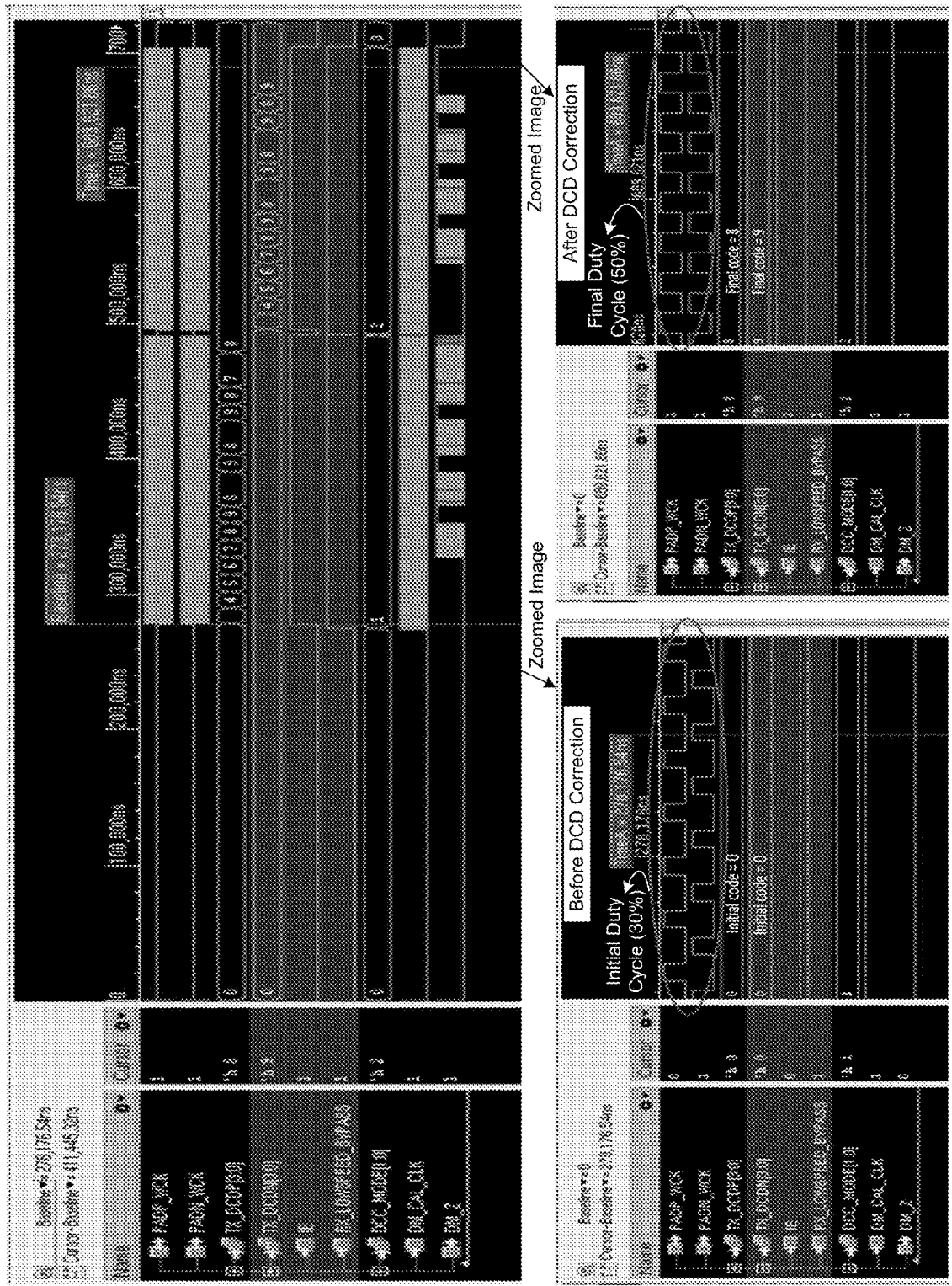
FIG. 11 shows a graphical user interface consistent with an embodiment of the present disclosure.

FIG. 11 shows a graphical user interface consistent with an embodiment of the present disclosure. The subwindows depicted in FIG. 11 show the duty cycle before and after correction.

Figure 12:
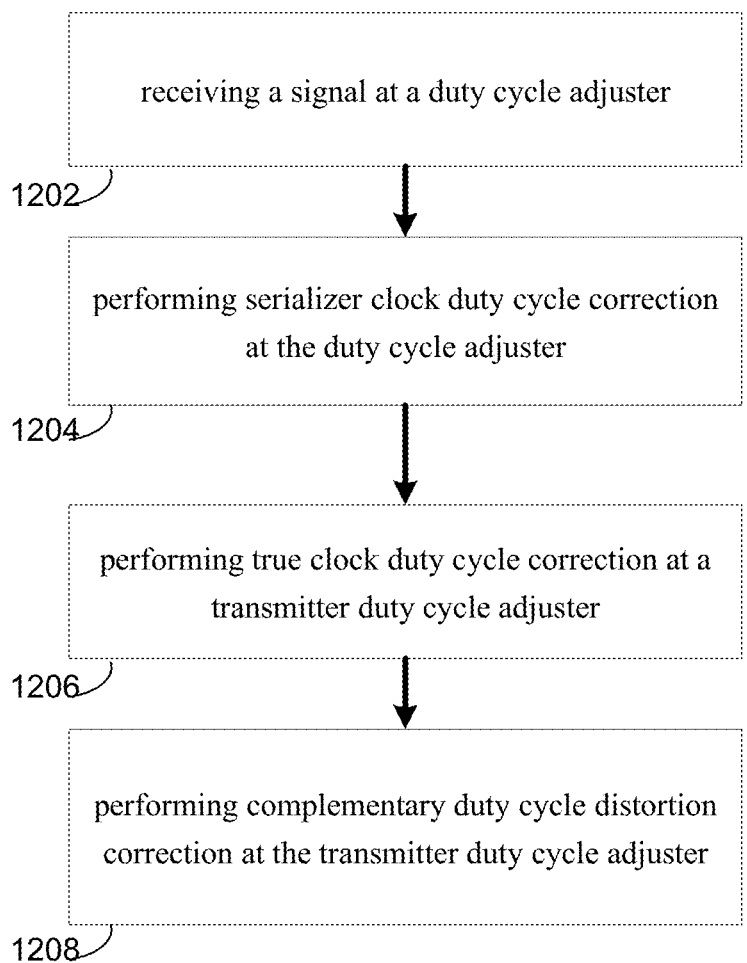
FIG. 12 includes a flowchart depicting operations consistent with an embodiment of the present disclosure.

Referring now to FIG. 12, a flowchart showing operations consistent with embodiments of the duty cycle correction method described herein. Operations may include receiving 1202 a signal at a duty cycle adjuster and performing 1204 serializer clock duty cycle correction at the duty cycle adjuster. The method may further include performing 1206 true clock duty cycle correction at a transmitter duty cycle adjuster and performing 1208 complementary duty cycle distortion correction at the transmitter duty cycle adjuster. Numerous other operations are also within the scope of the present disclosure as discussed above.

Embodiments of the duty cycle correction method included herein provided numerous advantages over existing approaches. The conventional approaches only correct the duty cycle until the serializer clock input and any duty cycle distortion introduced by further stages will be uncorrected. Embodiments included herein may be configured to correct the duty cycle until the last node of PHY. No additional hardware is required for finding the optimal reference voltage, as embodiments included herein may reuse the existing PHY receiver and VREF training FSM. Embodiments included herein do not use any predefined reference voltage, which may be different from the actual mid voltage of PAD_t and PAD_c. Embodiments included herein may first train the optimal reference voltage and then correct the duty cycle, which reduces error significantly. A low speed receiver path may be used as a probe point for monitoring the duty cycle without introducing any additional capacitor on the PAD_t and PAD_c signals, which keeps the transmit performance unaltered. As most of the duty cycle distortion of the differential PAD signal is caused due to the single ended PAD duty cycle distortion itself, the present disclosure may correct the individual duty cycle (PAD_t and PAD_c separately)

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A duty cycle correction method, comprising:
   receiving a signal at a duty cycle adjuster;
   performing serializer clock duty cycle correction at the duty cycle adjuster;
   performing true clock duty cycle correction at a transmitter duty cycle adjuster, wherein the transmitter duty cycle adjuster is included within a write clock (WCK) transmit path; and
   performing complementary duty cycle distortion correction at the transmitter duty cycle adjuster.

2. The duty cycle correction method of claim 1, further comprising:
   receiving an output of the transmitter duty cycle adjuster at a duty cycle monitor.

3. The duty cycle correction method of claim 1, further comprising:
   providing a true clock duty cycle correction output to a dynamic random access memory.

4. The duty cycle correction method of claim 1, further comprising:
   providing a complementary clock duty cycle correction output to a dynamic random access memory.

5. The duty cycle correction method of claim 1, further comprising:
   training an optimal reference voltage prior to performing transmit clock duty cycle correction.

6. The duty cycle correction method of claim 2, further comprising:
   determining one or more final duty cycle correction bits of the true clock duty cycle correction of the transmitter based upon, at least in part, an output from the duty cycle monitor.

7. The duty cycle correction method of claim 2, further comprising:
   determining one or more final duty cycle correction bits of the complementary clock duty cycle correction of the transmitter based upon, at least in part, an output from the duty cycle monitor.

8. The duty cycle correction method of claim 1, further comprising:
   receiving an output from the write clock (WCK) transmit path at a receiver.

9. The duty cycle correction method of claim 8, further comprising:
   receiving an output from the receiver at a duty cycle monitor.

10. A duty cycle correction system, comprising:
    a duty cycle adjuster configured to receive a signal and to perform serializer clock duty cycle correction; and
    a transmitter duty cycle adjuster configured to perform true clock duty cycle correction, wherein the transmitter duty cycle adjuster is further configured to perform complementary duty cycle distortion correction, wherein the transmitter duty cycle adjuster is included within a write clock (WCK) transmit path.

11. The duty cycle correction system of claim 10, further comprising:
    a duty cycle monitor configured to receive an output of the transmitter duty cycle adjuster.

12. The duty cycle correction system of claim 10, further comprising:
    a dynamic random access memory configured to receive a true clock duty cycle correction output.

13. The duty cycle correction system of claim 10, further comprising:
    a dynamic random access memory configured to receive a complementary clock duty cycle correction output.

14. The duty cycle correction system of claim 10, wherein an optimal reference voltage is trained prior to performing transmit clock duty cycle correction.

15. The duty cycle correction system of claim 11, further comprising:
    determining one or more final duty cycle correction bits of the true clock duty cycle correction of the transmitter based upon, at least in part, an output from the duty cycle monitor.

16. The duty cycle correction system of claim 11, further comprising:
    determining one or more final duty cycle correction bits of the complementary clock duty cycle correction of the transmitter based upon, at least in part, an output from the duty cycle monitor.

17. The duty cycle correction system of claim 10, further comprising:
    a receiver configured to receive an output from the write clock (WCK) transmit path.

18. The duty cycle correction system of claim 17, further comprising:
    a duty cycle monitor configured to receive an output from the receiver.

* * * * *